US010354888B2

(12) United States Patent
Tan et al.

(10) Patent No.: US 10,354,888 B2
(45) Date of Patent: *Jul. 16, 2019

(54) METHOD AND APPARATUS FOR ANISOTROPIC TUNGSTEN ETCHING

(71) Applicant: Lam Research Corporation, Fremont, CA (US)

(72) Inventors: Zhongkui Tan, San Jose, CA (US); Qian Fu, Pleasanton, CA (US); Huai-Yu Hsiao, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/463,869

(22) Filed: Mar. 20, 2017

(65) Prior Publication Data

US 2017/0194166 A1 Jul. 6, 2017

Related U.S. Application Data

(63) Continuation of application No. 14/589,424, filed on Jan. 5, 2015, now Pat. No. 9,633,867.

(51) Int. Cl.
*H01L 21/3213* (2006.01)
*H01L 21/67* (2006.01)
*H01J 37/32* (2006.01)

(52) U.S. Cl.
CPC .. *H01L 21/32136* (2013.01); *H01J 37/32449* (2013.01); *H01L 21/32138* (2013.01);
(Continued)

(58) Field of Classification Search
CPC ......... H01L 21/32136; H01L 21/67069; H01L 21/32138; H01L 21/32139; H01J 37/32449; H01J 2237/334
See application file for complete search history.

(56) References Cited

U.S. PATENT DOCUMENTS 4,786,360 A * 11/1988 Cote ........................ C23F 4/00
257/751
4,992,136 A 2/1991 Tachi et al.
(Continued)

FOREIGN PATENT DOCUMENTS

CN 1270415 A 10/2000
CN 102372250 A 3/2012

OTHER PUBLICATIONS

S. Wolf and R.N. Tauber, (Silicon Processing for the VLSI Era, vol. 1—Process Technology, Lattice Press, 1986)(pp. 544-547) (Year: 1986).*

(Continued)

*Primary Examiner* — Binh X Tran
*Assistant Examiner* — Mahmoud Dahimene
(74) *Attorney, Agent, or Firm* — Weaver Austin Villeneuve & Sampson LLP

(57) ABSTRACT

Methods for anisotropically etching a tungsten-containing material (such as doped or undoped tungsten metal) include cyclic treatment of tungsten surface with $Cl_2$ plasma and with oxygen-containing radicals. Treatment with chlorine plasma is performed while the substrate is electrically biased resulting in predominant etching of horizontal surfaces on the substrate. Treatment with oxygen-containing radicals passivates the surface of the substrate to etching, and protects the vertical surfaces of the substrate, such as sidewalls of recessed features, from etching. Treatment with $Cl_2$ plasma and with oxygen-containing radicals can be repeated in order to remove a desired amount of material. Anisotropic etching can be performed selectively in a presence of dielectric materials such as silicon oxide, silicon nitride, and silicon oxynitride.

13 Claims, 5 Drawing Sheets

(52) U.S. Cl.
CPC .. *H01L 21/32139* (2013.01); *H01L 21/67069* (2013.01); *H01J 2237/334* (2013.01)

(56) References Cited

U.S. PATENT DOCUMENTS

| | | | |
|---|---|---|---|
| 5,356,478 | A | 10/1994 | Chen et al. |
| 5,702,983 | A | 12/1997 | Shinohara |
| 6,017,826 | A | 1/2000 | Zhou et al. |
| 6,461,974 | B1 | 10/2002 | Ni et al. |
| 6,746,961 | B2 | 6/2004 | Ni et al. |
| 7,371,688 | B2* | 5/2008 | Ji .................. C23C 16/4405 257/E21.218 |
| 8,609,546 | B2 | 12/2013 | Lee et al. |
| 9,230,825 | B2 | 1/2016 | Subramanian et al. |
| 9,633,867 | B2 | 4/2017 | Tan et al. |
| 2003/0092280 | A1 | 5/2003 | Lee et al. |
| 2003/0235995 | A1* | 12/2003 | Oluseyi .................. C23F 4/00 438/710 |
| 2007/0023394 | A1* | 2/2007 | Murakami ........ H01J 37/32082 216/67 |
| 2008/0138996 | A1* | 6/2008 | Nishizuka ................ C23F 4/00 438/726 |
| 2011/0161670 | A1 | 6/2011 | Chase et al. |
| 2011/0244686 | A1 | 10/2011 | Aso et al. |
| 2014/0120727 | A1* | 5/2014 | Subramanian .... H01L 21/32136 438/696 |
| 2016/0196985 | A1 | 7/2016 | Tan et al. |

OTHER PUBLICATIONS

U.S. Office Action dated Dec. 4, 2015 issued in U.S. Appl. No. 14/589,424.
U.S. Final Office Action dated Mar. 25, 2016 issued in U.S. Appl. No. 14/589,424.
U.S. Office Action dated Aug. 10, 2016 issued in U.S. Appl. No. 14/589,424.
U.S. Notice of Allowance dated Dec. 28, 2016 issued in U.S. Appl. No. 14/589,424.
Wolf, S. et al. (1986) "Silicon Processing for the VLSI Era," Process Technology, Lattice Press,1:542-557.
Chinese First Office Action dated Dec. 20, 2017 issued in Application No. CN 20160004225.3.
Chinese Second Office Action dated Aug. 14, 2018 issued in Application No. CN 201610004225.3.

* cited by examiner

METHOD AND APPARATUS FOR ANISOTROPIC TUNGSTEN ETCHING

CROSS-REFERENCE TO RELATED APPLICATIONS

This application is a continuation of and claims priority to U.S. patent application Ser. No. 14/589,424 naming Tan et al. as inventors, titled "METHOD AND APPARATUS FOR ANISOTROPIC TUNGSTEN ETCHING" filed Jan. 5, 2015, which is incorporated herein by reference in its entirety and for all purposes.

FIELD OF THE INVENTION

The present invention pertains to methods of removing layers of material on a substrate. The methods are particularly useful for anisotropic removal of tungsten-containing material on a semiconductor substrate.

BACKGROUND OF THE INVENTION

Fabrication of integrated circuits (IC) on semiconductor substrates involves deposition and etching of multiple layers of materials in order to form a desired pattern of conductive paths in a layer of dielectric. Anisotropic etching (i.e. predominant etching in a selected direction) is a valuable tool for forming recessed features on semiconductor substrates. In a typical example of anisotropic etching, the material is etched out in a vertical direction, without horizontal etching. For example, the material can be removed from the bottom of a recessed feature, while preserving the width of the recessed feature.

Tungsten and tungsten-containing materials emerge as materials that find many uses in IC fabrication, both as conductive layers, and more recently as hardmasks in dynamic random-access memory (DRAM) and 3D NAND fabrication. While there is a variety of methods that can be used for tungsten deposition, including chemical vapor deposition (CVD), atomic layer deposition (ALD), and physical vapor deposition (PVD), the methods for tungsten etching are still limited. Specifically, the methods for anisotropic tungsten etching, particularly for selective anisotropic tungsten etching in a presence of dielectric materials, such as silicon oxide and silicon nitride, are in need of development.

SUMMARY

The methods provided herein may be used in the processes for manufacturing integrated circuits, such as in etching of tungsten-containing hardmask on a semiconductor wafer, e.g. during fabrication of DRAM and 3D NAND devices. The methods are suitable for anisotropic removal of tungsten-containing material. For example, the methods can be used to remove tungsten-containing material at the bottom of the recessed feature, while preventing removal of tungsten-containing material from the sidewalls of the recessed feature. Large amounts of tungsten-containing material can be directionally removed.

In one aspect, a method of anisotropically etching a tungsten-containing material on a semiconductor substrate in a plasma etching apparatus is provided. The method includes: (a) providing a semiconductor substrate comprising a tungsten-containing material to a plasma etching process chamber; (b) introducing a first process gas comprising $Cl_2$ to the plasma etching process chamber and forming a plasma to react the tungsten-containing material with a plasma-activated chlorine; (c) removing the first process gas from the plasma etching process chamber after (b); (d) introducing a second process gas comprising an oxygen radical source to the plasma etching process chamber and forming a plasma comprising oxygen radicals to passivate a surface of the tungsten-containing material; and (e) removing the second process gas from the plasma etching process chamber after (d), wherein the method predominantly etches the tungsten-containing material in a selected direction. A relatively large electrical bias should be applied to the substrate-holding support in order to ensure directional etching with plasma activated chlorine. In some embodiments a bias of at least about 500 V is provided to the substrate-holding support.

In some embodiments, the first processing gas consists essentially of $Cl_2$. In some implementations the first process gas comprises $Cl_2$ and an inert gas selected from the group consisting of $N_2$, He, Ar, $H_2$, and combinations thereof. In some embodiments it is preferable to pulse the plasma during treatment of the substrate with $Cl_2$. For example, plasma pulsing may be performed by intermittently increasing the bias voltage at the substrate holder with a duty cycle of between about 5-50%.

A variety of oxygen-containing gases can be used in the passivation step. For example, in some embodiments the second process gas comprises a source of oxygen radicals selected from the group consisting of $O_2$, $O_3$, CO, $CO_2$, COS, $SO_2$ and mixtures thereof. In some embodiments it is preferable to use $O_2$ as the source of oxygen radicals.

In order to etch a desired amount of material, operations (b)-(e) are typically repeated several times. In some embodiments operations (b)-(e) are repeated at least 3 times.

In the described method, the order of the etching and passivation operations may be reversed. For example, in some embodiments operations (b) and (c) are performed before operations (d) and (e). In other embodiments operations (d) and (e) are performed before operations (b) and (c).

The etching of tungsten-containing material can be performed selectively to other materials, such as silicon oxide, silicon nitride, silicon oxynitride, and combinations thereof. In some embodiments the substrate comprises an exposed layer of tungsten-containing material and an exposed layer of dielectric material selected from the group consisting of silicon oxide, silicon nitride, and silicon oxynitride, wherein the tungsten-containing material is selectively etched with a selectivity of at least about 2:1 relative to the dielectric material.

In one implementation the semiconductor substrate comprises a recessed feature comprising an exposed layer of tungsten-containing material at the bottom of the recessed feature. The etching can remove the tungsten-containing material from the bottom of the recessed feature without substantially altering the width or diameter of the recessed feature. In some embodiments the width or diameter of the recessed feature is less than about 150 nm.

The etching methods provided herein can be used to anisotropically etch relatively large amounts of tungsten-containing material. For example, in some embodiments, the etched tungsten-containing layer may have a thickness of between about 1,000-7,000 Å. In some embodiments, one cycle of operations (b)-(e) removes between about 10-50 nm of tungsten-containing material from the substrate.

The methods presented herein can be integrated into a processing scheme that involves photolithographic patterning. In some embodiments, provided methods further comprise: applying photoresist to the substrate; exposing the photoresist to light; patterning the photoresist and transferring the pattern to the substrate and selectively removing the photoresist from the substrate.

In another aspect, a plasma etching apparatus for anisotropically etching a tungsten-containing material on a semiconductor substrate is provided. The apparatus includes: (a) a process chamber having an inlet for introduction of a process gas; (b) a substrate support in the process chamber configured for holding the semiconductor substrate in position during etching of the tungsten-containing material, wherein the substrate support is configured to be biased at least during a portion of the etching; (c) a system configured for forming a plasma in the process chamber; and (d) a controller comprising instructions for: (i) introducing a first process gas comprising $Cl_2$ to the plasma etching process chamber and forming a plasma to react the tungsten-containing material with a plasma-activated chlorine; (ii) removing the first process gas from the plasma etching process chamber after (i); (iii) introducing a second process gas comprising an oxygen radical source to the plasma etching process chamber and forming a plasma comprising oxygen radicals to passivate a surface of the tungsten-containing material; and (iv) removing the second process gas from the plasma etching process chamber after (iii), wherein the method predominantly etches the tungsten-containing material in a selected direction.

In another aspect, a system is provided, wherein the system includes an apparatus provided herein and a stepper.

In another aspect, a non-transitory computer machine-readable medium is provided, wherein the medium comprises program instructions for the plasma etching apparatus, wherein the program instructions include the code for: (i) introducing a first process gas comprising $Cl_2$ to the plasma etching process chamber and forming a plasma to react the tungsten-containing material with a plasma-activated chlorine; (ii) removing the first process gas from the plasma etching process chamber after (i); (iii) introducing a second process gas comprising an oxygen radical source to the plasma etching process chamber and forming a plasma comprising oxygen radicals to passivate a surface of the tungsten-containing material; and (iv) removing the second process gas from the plasma etching process chamber after (iii), wherein the method predominantly etches the tungsten-containing material in a selected direction.

These and other features and advantages of the invention will be described in more detail below with reference to the associated drawings.

DETAILED DESCRIPTION OF A PREFERRED EMBODIMENT

Figure 1:
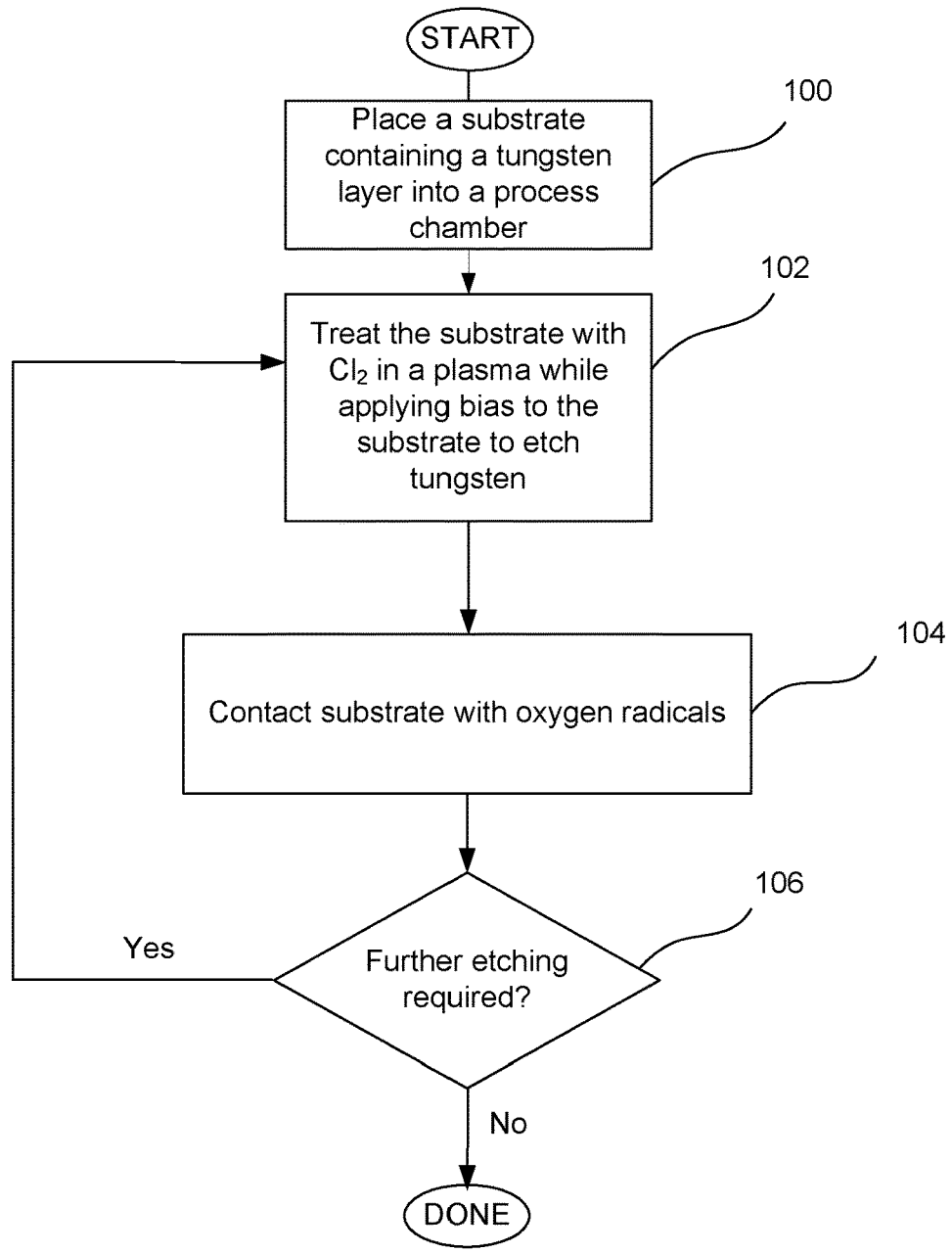
FIG. 1 is a process flow diagram for an etching method in accordance with an embodiment provided herein.

Aspects of the present invention are directed to anisotropic etching of tungsten-containing material from substrates, such as partially fabricated integrated circuits. For example the methods can be used for etching tungsten-containing hardmasks in DRAM and 3D NAND manufacturing as well as for etching tungsten-containing gate electrodes. While the methods of present invention find particular use in the processing of semiconductor substrates (i.e., substrates that contain semiconductor material at any location of the structure), they can also be employed in other applications. Provided methods achieve anisotropic removal of tungsten-containing material using sequential application of $Cl_2$-based etchant and oxygen-based passivation agent.

Tungsten-containing material that can be removed by provided methods typically contains at least about 30% atomic tungsten (such as at least about 50%, at least about 75%, or at least about 95% atomic tungsten). Examples include doped tungsten metal, undoped tungsten metal (e.g., at least 95% pure tungsten metal), stoichiometric and non-stoichiometric tungsten compounds, as well as alloys and solid solutions. For example tungsten may be doped with nitrogen, carbon, phosphorus and combinations thereof.

The methods provided herein are capable of selectively etching the tungsten-containing material in a presence of silicon-containing dielectric materials, such as silicon oxide, silicon nitride, and silicon oxynitride. These dielectric materials may be doped or undoped, and need not be stoichiometric. The term "silicon oxide" as used herein includes a variety of types of silicon oxides, silicates, and silicate-based glasses, such as tetraethylorthosilicate (TEOS), borosilicate glass (BSG), borophosphosilicate glass (BPSG), high density plasma (HDP) CVD oxide, and subatmospheric (SA) CVD oxide. The selectivity can be at least about 2:1 (referring to the ratio of etch rates in a single desired direction), and in some embodiments is at least about 3:1.

The methods, in some embodiments, are characterized by high anisotropy of the etch. Thus, tungsten can be removed preferentially in a desired direction, e.g., from a bottom of recessed feature while the width of recessed feature may be substantially unchanged (i.e., may remain unchanged or increase by no more than 50%, such as by no more than 10%). In some embodiments the ratio of etch rate of tungsten-containing material in a preferred direction (e.g., rate of removal from the bottom of the recessed feature) to an etch rate in a non-preferred direction (e.g., rate of removal from the sidewall of a recessed feature) is at least about 20 to 1, preferably 50 to 1, and even more preferably 100 to 1.

The methods can be used for removal of any amount of tungsten-containing material, and are particularly useful for removal of relatively large amounts of tungsten-containing material (such as between about 3,000 Å-7,000 Å) from the bottom portions of relatively narrow recessed features (e.g., features with widths of less than about 150 nm, such as between about 20-150 nm, or between about 20-50 nm). The provided methods may exhibit distinct advantages over conventional tungsten etches that are performed using fluorine-based chemistry. The advantages may include high selectivity of the tungsten etch in the presence of exposed silicon oxide, and excellent anisotropy, which allows preservation of widths of recessed features during etching. The provided methods may also provide significantly higher etch rates than methods that rely on simultaneous introduction of $Cl_2$ and $O_2$ in a plasma. For example the etch rate in the provided methods is typically at least about 20 nm/min, such as at least about 40 nm/min, e.g., between about 40-100 nm/min. Another advantage of presented methods, is the effectiveness of the etch in high aspect ratio recessed features. Thus, for example, tungsten-containing material can be removed from the bottom portions of recessed features having an aspect ratio of at least about 5:1, such as at least about 8:1 (e.g., features with an aspect ratio of about 10:1).

The methods will now be illustrated using tungsten etching as an example. It is understood that any tungsten-containing material described above, can be similarly etched using these methods.

An example of a process flow diagram for a tungsten etching method is provided in FIG. 1. Cross-sectional depictions of a substrate illustrating various stages of etching are shown in FIGS. 2A-2E.

Figure 2A:
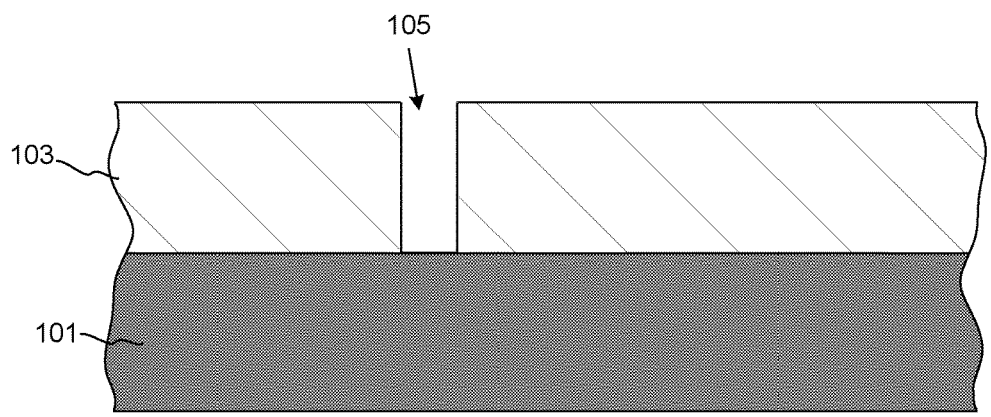
FIGS. 2A-2E present cross-sectional depictions of a substrate undergoing etching in accordance with embodiments provided herein.

The process starts in 100 by placing a substrate containing a tungsten layer into a process chamber. Generally, a wide variety of substrates containing exposed tungsten layers can be used. The substrate may also contain an exposed layer of another material, e.g. silicon oxide, silicon nitride, silicon oxynitride or a combination thereof. In some embodiments the substrate contains a recessed feature, and the layer of tungsten is disposed at the bottom of the recessed feature. Such substrate is illustrated in FIG. 2A. The substrate contains a tungsten layer 101, a silicon oxide or silicon nitride layer 103, disposed over the tungsten layer 101, and a recessed feature 105 made in the layer 103 such that tungsten is exposed at the bottom of the recessed feature. Tungsten can be etched in any process chamber that allows for plasma generation with application of a bias to the substrate holder in order to direct ions generated in a plasma vertically towards the substrate. A variety of dry etching chambers are suitable for such etching. An example of a suitable apparatus is a KiyoFX apparatus available from Lam Research Corporation. An apparatus having an electron cyclotron resonance (ECR) source may also be used for the etching.

Figure 2B:
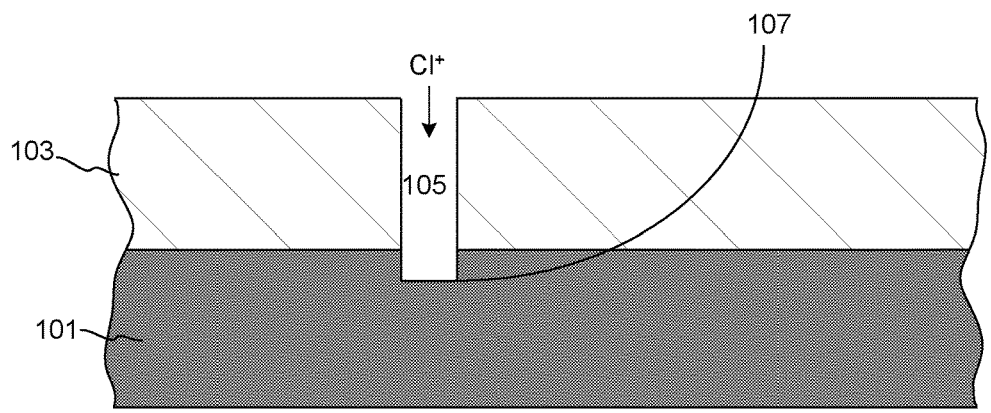

After the substrate is placed into the process chamber, a process gas that includes $Cl_2$ is flowed into the process chamber and a plasma is formed while bias is applied to the substrate, allowing for directional etching of the tungsten with chlorine ions, as shown in operation 102. This step is referred to as the etching step. In some embodiments the process gas consists essentially of $Cl_2$. In some embodiments the process gas may further include one or more inert gases, such as nitrogen, hydrogen, helium, argon, and neon. The process gas preferably does not contain any substantial amounts of fluorine-containing gases. For example, the $Cl_2$-containing process gas may be completely free of fluorine-containing gases or may contain no more than 1% by volume of such gases. In some embodiments the $Cl_2$-containing process gas does not contain substantial amounts of oxygen-containing gases. For example, the $Cl_2$-containing process gas may be completely free of oxygen-containing gases or may contain no more than 1% by volume of such gases. An important feature of anisotropic etching with $Cl_2$ plasma is a relatively high bias applied to the substrate holder that ensures directional etching, where the direction of etching is determined by the direction of $Cl^+$ ion bombardment. The $Cl^+$ ions are attracted towards the negatively biased substrate and have sufficient energy to react with tungsten and to remove $WCl_x$ that is formed in the reaction from the surface of the substrate. Due to directionality of $Cl^+$ treatment, the rate of tungsten removal from horizontal surfaces on the substrate (e.g., bottom of a recessed feature) is greater than the rate of tungsten removal from vertical surfaces (e.g., sidewalls of a recessed feature). The bias applied to the substrate chuck should be at least about 500 V. For example, in some embodiments it is preferable to apply a bias of at least about 750 V, such as at least about 1000 V. In some embodiments a bias of between about 1000-1700 V is applied. In some embodiments, it is preferable to apply the bias in pulses, where each pulse is provided at a voltage level that is listed above, whereas the baseline level between pulses may be zero volts or a relatively low potential (e.g., less than about 200 V). The duty cycle of the pulsing is between about 5-50% in some embodiments. In one example the duty cycle is 10% and the frequency is 100 Hz. The bias is typically an RF bias that induces a negative DC bias at the substrate. FIG. 2B illustrates a substrate obtained during $Cl_2$ etching in a plasma. The $Cl^+$ ions directed vertically towards the substrate etch tungsten layer 101 at the bottom of the recessed feature 105. The etched portion 107 shows no substantial widening of the recessed feature because the etching proceeds anisotropically in the vertical direction.

After $Cl_2$ treatment is completed, the excess $Cl_2$ and reaction products are removed from the process chamber. For example, the process chamber may be purged with a purging gas (e.g., nitrogen, hydrogen, helium, argon, neon or combinations thereof) and/or evacuated.

Next, in operation 104 the substrate is contacted with oxygen radicals. The purpose of this step is to passivate the surface of tungsten towards subsequent etching with lower-energy $Cl^+$ ions. This step is referred to as the passivation step. This step includes introducing a second process gas into the process chamber, where the second process gas includes a source of oxygen radicals, such as $O_2$, $O_3$, CO, $CO_2$, COS, $SO_2$ and mixtures thereof, and forming a plasma. For example, in some embodiments, the second process gas includes $O_2$ or consists essentially of $O_2$. In some embodiments, an inert gas, e.g., He, Ar, Ne or a combination of these gases, may be included in the second process gas in addition to the source of oxygen radicals. In some embodiments a hydrofluorocarbon, such as $CH_3F$ is added to the second process gas. Preferably, the flow rate ratio of hydrofluorocarbon flow to the source of oxygen radicals flow is less than about 1 to 10. The plasma is formed in the process chamber such that the plasma is not highly directional, and the substrate holder RF bias in this step is kept relatively low or is absent. In some embodiments the substrate holder RF bias is less than about 200 V, such as less than about 150 V. In some embodiments a bias of about 100 V is used. In some embodiments the plasma containing oxygen radicals is formed directly in the process chamber where the substrate is processed. In other embodiments the oxygen radicals may be formed in a remote plasma chamber connected with the process chamber, and the oxygen radicals are supplied from the remote plasma chamber to the process chamber via a conduit.

Figure 2C:
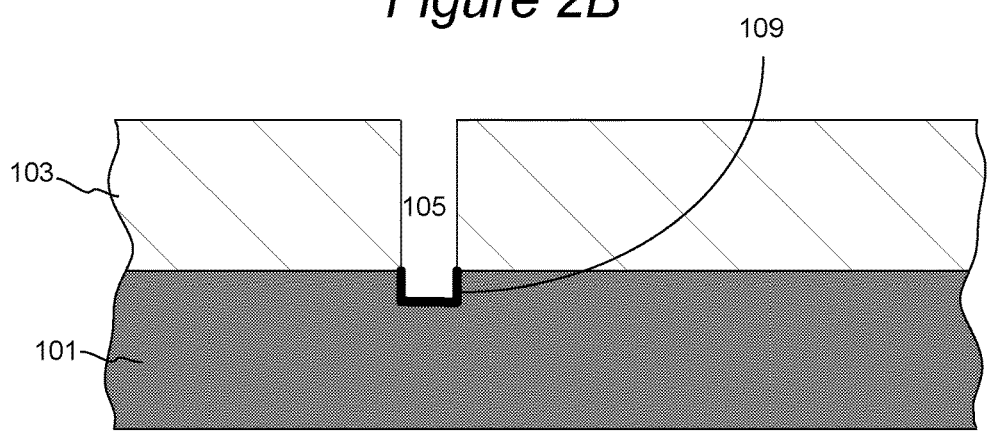

FIG. 2C shows a substrate that is undergoing the oxygen passivation step. A passivation layer 109, which contains $WO_x$ and $WClO_x$ species is formed on all available tungsten surfaces, which in this case include tungsten-containing part of the recessed feature's sidewalls as well as recessed feature's bottom.

Next, the process chamber is purged and/or evacuated to remove the source of oxygen radicals, and in operation 106 it is decided whether further etching is required. In many embodiments, $Cl_2$ etching and oxygen passivation steps should be repeated multiple times, such as at least 3 times. Often, between about 10-30 cycles are performed. When no more etching is desired, the process is completed.

Figure 2D:
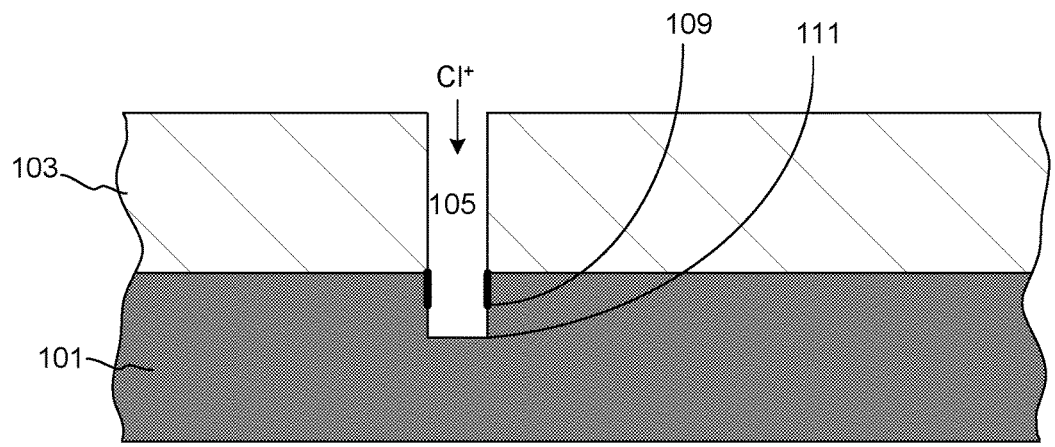
Figure 2E:
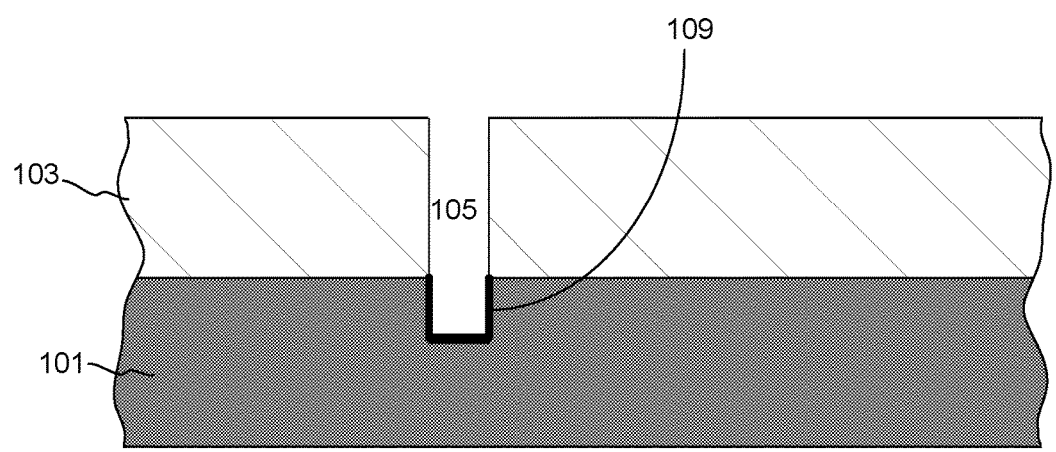

FIG. 2D illustrates a substrate that undergoes a second cycle of etching with $Cl_2$ in a plasma. In this step, the passivation layer 109 is preserved on the sidewall of the recessed feature but is removed from the bottom of the recessed feature by the directional etching. An additional amount of tungsten is removed from the bottom of the recessed feature, opening an unpassivated area 111. Next, after purging or evacuation of the process chamber, this area is passivated by the treatment with oxygen radicals and provides a structure shown in FIG. 2E, where passivation layer 109 once again covers all available exposed tungsten surface.

The etching process can remove relatively large amounts of tungsten without substantially changing the width of a recessed feature. In some cases layers having a thickness of between about 1000-7000 Å, such as between about 300-7000 Å, are removed. Typically each cycle of etching (one etching operation with $Cl_2$ plasma and one passivation with oxygen radicals) removes between about 5-50 nm of tungsten layer thickness, such as between about 10-50 nm.

The amount of tungsten that is removed per cycle is governed by the desire to preserve the width of the recessed feature. Thus, if the etching step is performed for a longer time, etching out a thicker layer of tungsten, the width of the recessed feature may be increased due to some lateral etching. The frequent passivation steps ensure that the lateral etching is suppressed and the width of the recessed feature is substantially preserved.

The order of $Cl_2$ plasma treatment and passivation with oxygen radicals may be as shown in FIG. 1, or it may be reversed. For example in some embodiments the process starts with treatment of the substrate with oxygen radicals in a passivation step and is followed by treatment with $Cl_2$ in a plasma in an etching step, where the process chamber is purged and/or evacuated to remove excess reactants and reaction products after each treatment. Next, the passivation step and the etching step may be repeated as many times as necessary to etch the desired amount of material.

The process conditions for the described dry etching methods can vary. In some embodiments, the process is conducted at a pressure of between about 0.5-400 mTorr and at a temperature of between about 30-100° C., such as between about 30-70° C. (where the temperature is measured at the substrate holder). The plasma, in some embodiments, is generated using an inductively coupled plasma (ICP) excitation source, e.g., operating at frequency of about 13.56 MHz.

Apparatus

The processes provided herein can be practiced in any apparatus that is adapted for plasma generation, and that has a system for providing a bias to the substrate holder. These apparatuses may include apparatuses that have sources for generating inductively coupled plasma (ICP), capacitively couled plasma (CCP), and ECR sources.

The suitable apparatus typically includes a process chamber having an inlet for introduction of a process gas; a substrate support in the process chamber configured for holding the semiconductor substrate in position during etching of the tungsten-containing material, wherein the substrate support is configured to be biased at least during a portion of the etching; a system configured for forming a plasma in the process chamber; and a controller comprising program instructions for performing any of the methods described herein.

Figure 3:
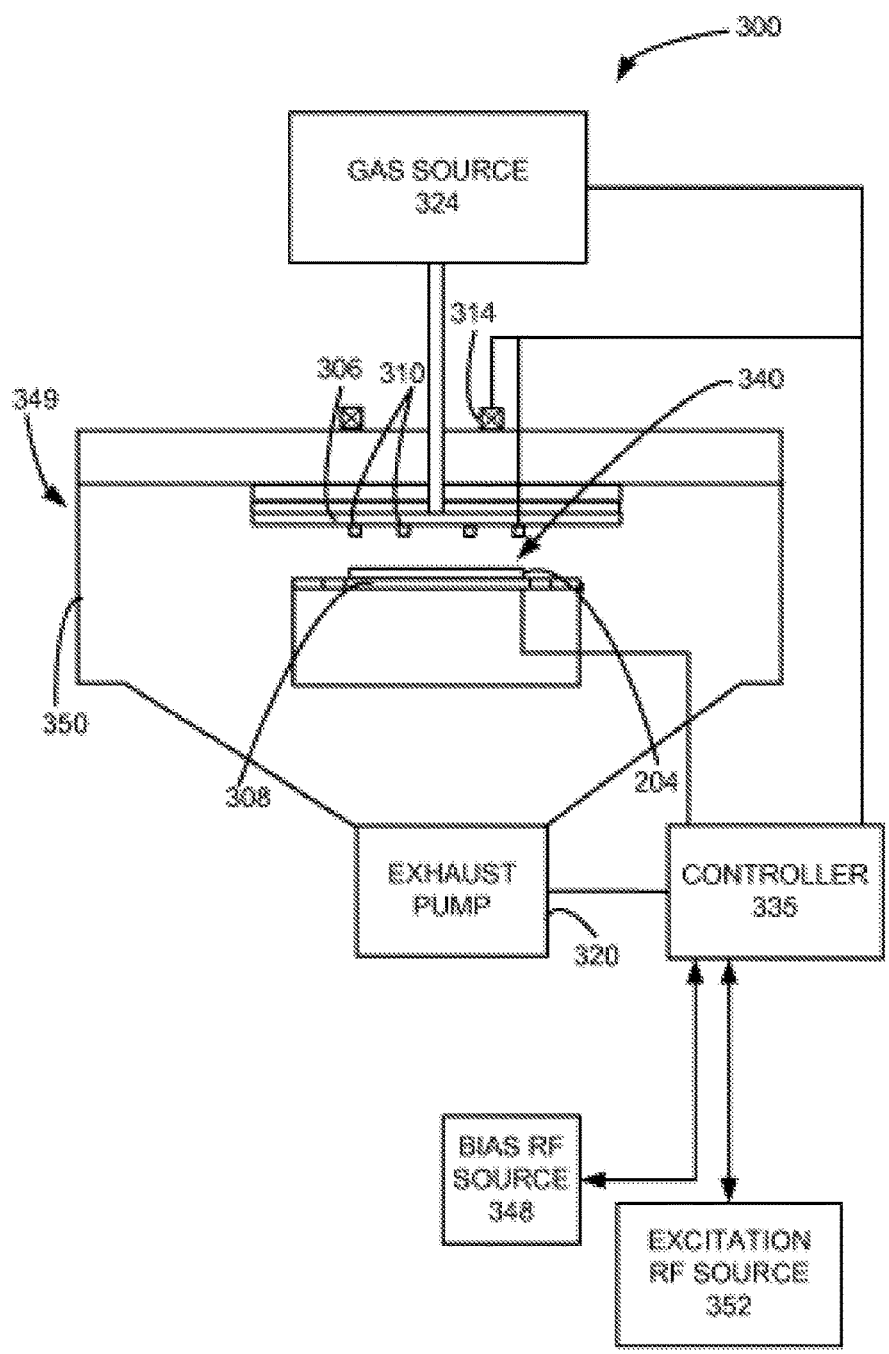
FIG. 3 is a schematic cross-sectional depiction of an apparatus suitable for performing etching reactions provided herein, in accordance with one embodiment.

FIG. 3 is a schematic view of one example of an etch reactor that may be used in practicing the invention. In one or more embodiments of the invention, an etch reactor 300 comprises an antenna electrode 314, a gas distribution plate 306 providing a gas inlet, and an electrostatic chuck (ESC) 308, within an etch process chamber 349, enclosed by a chamber wall 350. Within the etch process chamber 349, the substrate 204 is positioned on top of the electrostatic chuck 308. The electrostatic chuck 308 provides a bias from the bias RF source 348 as an electrostatic chuck for holding the substrate 204 or may use another chucking force to hold the substrate 204. A heat source 310, such as heat lamps is provided to heat the substrate. A gas source 324 is connected to the etch chamber 349 through the distribution plate 306.

A bias RF source 348 and an excitation RF source 352 are electrically connected to the etch process chamber 349 through a controller 335 to provide power to the antenna electrode 314 and the ESC 308. The bias RF source 348 generates bias RF power and supplies the bias RF power to the etch process chamber 349. In this example, the bias RF power has a frequency of 2 MHz. The excitation RF source 352 generates source RF power and supplies the source RF power to the etch process chamber 349. In this example, this source RF power has a frequency of 13.56 MHz.

The different RF signals may be supplied to various combinations of the top and bottom electrodes. Preferably, the lowest frequency of the RF should be applied through the ESC 308 on which the material being etched is placed. In this example, the excitation RF source 352 provides power to the antenna electrode 314.

The controller 335 is also connected to the gas source 324. The controller 335 controls the flow of the etch gas into the etch process chamber 349, the chamber pressure, as well as the generation of the RF power from the RF sources 348 and 352, the ESC 308, the antenna electrode 314, and the exhaust pump 320. The gas distribution plate 306 is connected to the gas source 324, and serves as a gas inlet for gas from the gas source 324. The exhaust pump 320 serves as as gas outlet removing gas, which passes from the gas distribution plate 306 through the plasma region 340 to the exhaust pump 320. The exhaust pump 320 may help to control pressure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Example

Figure 4:
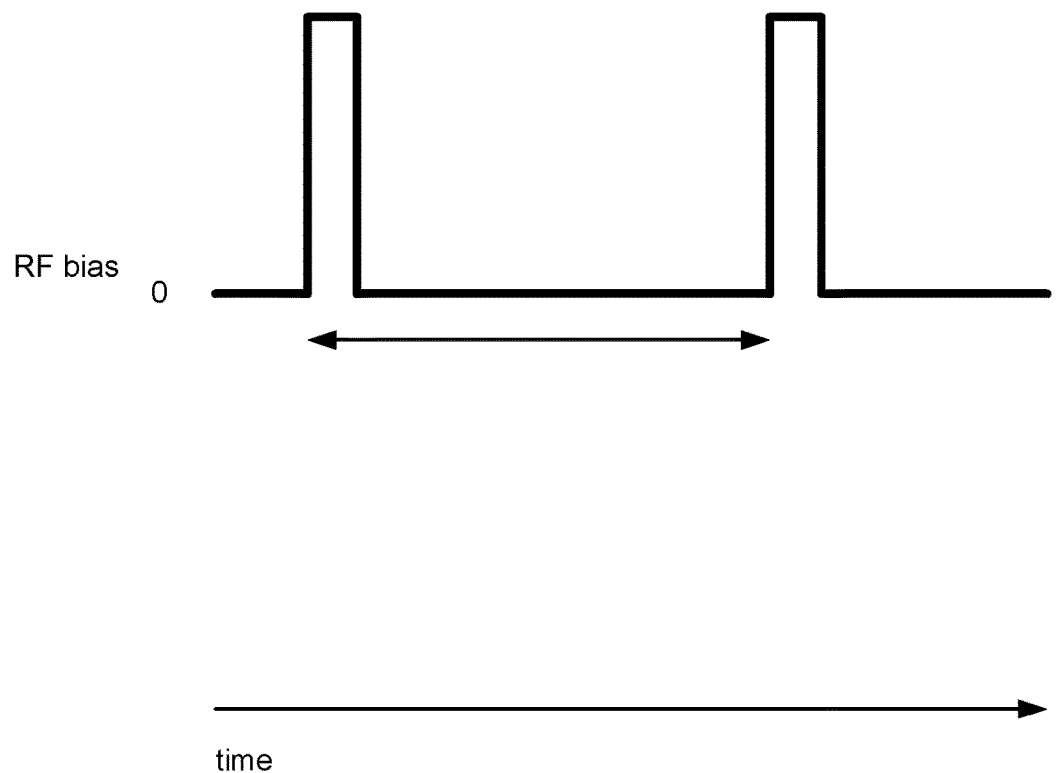
FIG. 4 is a timing diagram illustrating radio frequency (RF) pulses during $Cl_2$ etching in a plasma in accordance with one embodiment presented herein.

In an experimentally validated example a substrate including an array or matrix of recessed features was provided. The recessed features had an aspect ratio of 10:1 and width of 27 nm. The recessed features were made in a silicon oxide material and had an exposed layer of tungsten at the bottom of recessed features. Tungsten was etched in the Kiyo FX apparatus available from Lam Research Corporation. The substrate was placed into the process chamber and $Cl_2$ was provided to the process chamber at a flow rate of 100 sccm. The plasma was formed by providing a power of 300 W to the 13.56 MHz ICP excitation source, and by providing a 1500 V RF bias to the substrate holding chuck. The bias was applied in pulses with a 10% duty cycle. The timing diagram for bias pulsing is schematically illustrated in FIG. 4. The substrate was treated with $Cl_2$ in a plasma for 12 seconds at a pressure of 5 mTorr and a temperature of 70° C. (referring to a temperature at the substrate holder). Next, the process chamber was purged, and a mixture of $O_2$ (provided at a flow rate of 200 sccm) and $CH_3F$ (provided at a flow rate of 10 sccm) was flowed in the process chamber. Plasma was formed without pulsing by providing a power of 2500 W to the 13.56 MHz ICP excitation source, while a bias of 100 V was applied to the substrate holder. The treatment with oxygen radicals was conducted for 3 seconds at a temperature of 70° C. The process chamber was then purged, and the etching and passivation steps were repeated 30 times. The total thickness of tungsten removed from the bottom of recessed features was 250 nm, with about 8 nm removed per cycle of etching. The width of the recessed features at the end of etching was 28 nm.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of anisotropically etching a tungsten-containing material on a semiconductor substrate in a plasma etching apparatus, the method comprising:
   (a) providing a semiconductor substrate comprising a tungsten-containing material to a plasma etching process chamber;
   (b) introducing a first process gas to the plasma etching process chamber, wherein the first process gas consists essentially of $Cl_2$, and forming a plasma to react the tungsten-containing material with a plasma-activated chlorine, etch the tungsten-containing material and expose a new surface of the tungsten-containing material;

(c) removing the first process gas from the plasma etching process chamber after (b);

(d) directly after removing the first process gas from the plasma etching process chamber, introducing a second process gas comprising an oxygen radical source and a hydrofluorocarbon to the plasma etching process chamber and forming a plasma comprising oxygen radicals to react the plasma with the new exposed surface of the tungsten-containing material and thereby form a passivation layer comprising a compound that includes tungsten and oxygen, wherein the oxygen radical source is a gas selected from the group consisting of $O_2$, $O_3$, CO, $CO_2$ and mixtures thereof; and (e) removing the second process gas from the plasma etching process chamber after (d), wherein the method predominantly etches the tungsten-containing material in a selected direction.

2. The method of claim 1, wherein forming a plasma in (b) comprises providing a bias of at least about 500 V to a substrate-holding support.

3. The method of claim 1, wherein the hydrofluorocarbon is $CH_3F$.

4. The method of claim 1, wherein (b) comprises pulsing the plasma.

5. The method of claim 1, wherein the source of oxygen radicals is $O_2$.

6. The method of claim 1, wherein operations (b) (e) are repeated.

7. The method of claim 1, wherein the semiconductor substrate further comprises an exposed layer of a dielectric material selected from the group consisting of silicon oxide, silicon nitride, and silicon oxynitride.

8. The method of claim 1, wherein the semiconductor substrate further comprises an exposed layer of a dielectric material selected from the group consisting of silicon oxide, silicon nitride, and silicon oxynitride, and wherein the tungsten-containing material is etched with an etch selectivity of at least about 2:1.

9. The method of claim 1, wherein the semiconductor substrate comprises a recessed feature comprising an exposed layer of tungsten-containing material at the bottom of the recessed feature, and wherein the etching removes the tungsten-containing material from the bottom of the recessed feature without substantially altering the width or diameter of the recessed feature.

10. The method of claim 1, wherein the method comprises etching a layer of tungsten-containing material having a thickness of between about 1000-7000 Å.

11. The method of claim 1, wherein the semiconductor substrate comprises a recessed feature comprising an exposed layer of tungsten-containing material at the bottom of the recessed feature, wherein the width or diameter of the recessed feature is less than about 150 nm.

12. The method of claim 1, wherein a single sequence of operations (b)-(e) removes between about 10-50 nm of the tungsten-containing material.

13. The method of claim 1, wherein the compound that includes tungsten and oxygen is selected from the group consisting of $WO_x$ and $WOCl_x$.

* * * * *